(12) United States Patent
Gauthier et al.

(10) Patent No.: US 6,411,480 B1
(45) Date of Patent: Jun. 25, 2002

(54) SUBSTRATE PUMPED ESD NETWORK WITH TRENCH STRUCTURE

(75) Inventors: Robert J. Gauthier, Hinesburg; Steven H. Voldman, South Burlington, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/259,541

(22) Filed: Mar. 1, 1999

(51) Int. Cl.$^7$ ................................................ H02H 9/00
(52) U.S. Cl. ...................................................... 361/56
(58) Field of Search ................................. 361/56, 91, 1, 361/111, 119, 54; 257/355–358

(56) References Cited

U.S. PATENT DOCUMENTS

| | | | | |
|---|---|---|---|---|
| 4,400,711 A | * | 8/1983 | Avery | 361/56 |
| 5,301,084 A | | 4/1994 | Miller | 361/91 |
| 5,400,202 A | * | 3/1995 | Metz et al. | 361/56 |
| 5,528,188 A | | 6/1996 | Au et al. | 327/310 |
| 5,581,103 A | | 12/1996 | Mizukami | 257/355 |
| 5,672,527 A | | 9/1997 | Lee | 437/41 RLD |
| 5,686,751 A | | 11/1997 | Wu | 257/356 |
| 5,705,841 A | | 1/1998 | Yu | 257/355 |
| 5,742,085 A | | 4/1998 | Yu | 257/360 |
| 5,751,042 A | | 5/1998 | Yu | 257/360 |
| 5,754,380 A | | 5/1998 | Ker et al. | 361/56 |

FOREIGN PATENT DOCUMENTS

| | | | | |
|---|---|---|---|---|
| EP | 0 549 320 A1 | 6/1993 | | H01L/27/02 |
| JP | 02-119262 | 5/1990 | | H01L/27/04 |

* cited by examiner

*Primary Examiner*—Ronald W. Leja
(74) *Attorney, Agent, or Firm*—Connolly, Bove, Lodge & Hutz LLP.

(57) ABSTRACT

An ESD protection circuit which may be implemented in thin epitaxial substrate surfaces. The protection device includes a MOSFET transistor or bipolar transistor implemented in a trench isolated area of the substrate. The isolation of the MOSFET transistor permits the substrate region to be pumped with an electric charge which reduces the trigger/snapback voltage and MOSFET threshold voltage for the device. A trigger current supplies the pumping current to the isolated substrate area when a transient voltage is applied thus lowering the trigger/snapback voltage of the MOSFET transistor in the presence of a transient voltage.

17 Claims, 7 Drawing Sheets

SUBSTRATE PUMPED ESD NETWORK WITH TRENCH STRUCTURE

BACKGROUND OF THE INVENTION

The present invention relates to electrostatic discharge protection devices for the input/output circuits of an integrated circuit. Specifically, an NMOS device is provided having a lower trigger threshold for discharging any electrostatic voltages which appear on a terminal of the integrated circuit.

The manufacture of integrated circuits for CMOS or NMOS implemented devices often include an electrostatic discharge device( ESD) connected to each of the input or output pins of the integrated circuit. In the event that an electrostatic charge is coupled to an input or output pin of the device, an ESD protection device will drain the charge safely away from the functional circuit connected to a respective terminal. These ESD devices are located on all pins which connect to functional circuitry which can be damaged by an electrostatic charge. The objective of the devices which utilize a MOSFET or CMOS FET, connected across the input pin, is to trigger the device in a snapback mode to conduct current at a lower threshold voltage than the connected functional circuitry, thereby shunting to ground the electrostatic charge to avoid damaging the functional circuitry.

The ESD devices are more difficult to implement in advanced integrated circuit technology. For instance, when thin epitaxial substrates are utilized, the substrate resistance is reduced and the conduction threshold of the MOS devices which make up the functional circuitry increases since more avalanche generation is needed at the drain substrate junction before the substrate/source junction forward biases. The increase in the threshold voltage for turning on the MOS device, when used in the ESD snap-back mode, renders it problematical that the device can be switched on before the functional circuitry is damaged by the incident electrostatic charge.

The ESD devices tend to be implemented as single finger or multiple finger devices for multiple terminals of the integrated circuit. When the ESD protection device is triggered OFF, the sustaining/holding voltage maintains the device on until the electrostatic charge has been safely shunted around the functional circuitry. As the threshold, or snap-back voltage increases, the voltage difference between the trigger/snap-back voltage and the sustaining holding voltage for maintaining the ESD protection device conductive increases. The result may be that only one of the multiple fingers is able to turn on, if the difference between the trigger and holding voltage is large. On the other hand, if the difference between the trigger and holding voltage for the ESD protection device is small, then when one of the ESD protection devices turns on, it will build up enough voltage to turn on the rest of the fingers and thus the entire parallel array of ESD protection devices are used to efficiently dissipate the electrostatic charge. The present invention is directed to an ESD protection device having a decreased trigger voltage and a lower voltage difference between the trigger and holding voltage for the device.

SUMMARY OF THE INVENTION

The present invention provides for a circuit which protects an integrated circuit from an externally applied transient voltage. The ESD protection device comprises a transistor placed in an isolated area of the integrated circuit substrate. The transistor operates in response to a positive potential electrostatic pulse either as a transistor in an "on" state, or in a snapback mode as a parasitic bipolar transistor which dissipates the electrostatic voltage connected to the integrated circuit terminal.

The transistor in a preferred embodiment is a MOS device which is maintained isolated by a trench guard ring on four sides of the MOS device, permitting charge pumping of the isolated substrate. During an ESD event, an electric charge is coupled to the isolated substrate area which pumps the isolated substrate area, increasing its voltage potential with respect to the remaining substrate area. The increased substrate potential requires less avalanche at the drain/substrate junction of the transistor. The result is a reduced threshold voltage to turn on the transistor, and a reduced snapback voltage necessary to turn on the parasitic bipolar transistor.

In one embodiment of the invention, a trigger circuit is used to charge the isolated substrate area by injecting carriers into the isolated substrate area in response to the electrostatic potential applied to the terminal.

In one embodiment of the invention, the trigger circuit may be a vertical bipolar transistor formed in the isolated substrate area. The vertical transistor has a collector, connected to charge the isolated substrate area, and an emitter tied to the input terminal so that current is applied to the isolated area of the substrate.

DESCRIPTION OF THE PREFERRED EMBODIMENT

Figure 1:
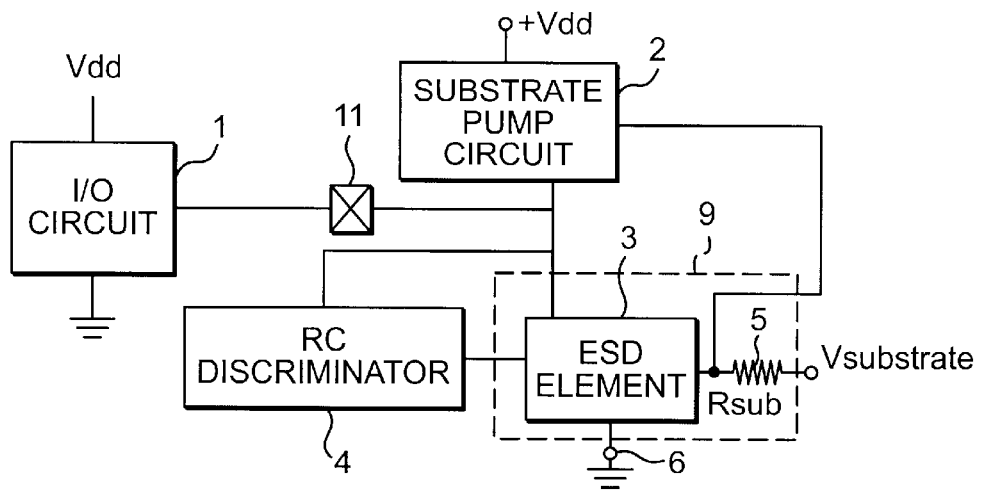
FIG. 1 is a block diagram illustrating the implementation of ESD protection on a circuit pad in accordance with one embodiment of the invention.

Referring now to FIG. 1, a high level block diagram of an implementation of an ESD protection circuit in accordance with one embodiment of the invention is shown. The ESD protection circuit is connected to a pad 11 of the integrated circuit which provides for outboard connections to an I/O circuit 1. In order to protect the I/O circuit 1 from electrostatic charge which may be discharged to pad 11, an ESD element 3, such as a MOSFET or bipolar transistor, is connected from the pad 11 to a ground connection 6. During an ESD event, the potential of pad 11 rises precipitously and ESD element 3 is rendered conductive to dissipate the charge. In the implementation according to FIG. 1, the ESD element conduction threshold is lowered so ESD element 3 begins conduction prior to any damage occurring on the devices constituting the input/output circuit 1.

The lower threshold for the ESD element is obtained by isolating a portion of the substrate containing ESD element 3 from the remaining portion of the substrate, and pumping the isolated portion to a potential higher than the remaining portion of the substrate. In accordance with the preferred embodiment, the isolation is obtained by locating the ESD element 3 within a trench structure 9 of the substrate. The isolated ESD semiconductor element 3 is electrically separated from the main portion of the substrate by a substrate resistance 5 so that the ESD element 3 may be charged to a potential above the substrate voltage. As will be evident with the more detailed description of the preferred embodiment of the invention, raising the potential of the substrate adjacent the conductive channel of an ESD MOSFET semiconductor element lowers the gate-source threshold $V_t$ for the device.

The ESD element is turned on by coupling the electrostatic voltage on pad 11 through an RC discriminator circuit 4 to an electrode of the ESD element 3. When a MOSFET is used as the ESD element, the gate connection receives a differentiated pulse from the RC discriminator 4, gating the MOSFET into conduction.

The ESD element once rendered conductive, may by virtue of the effect of parasitic bipolar action, increase conduction as the drain-source current increases in the bipolar parasitic mode.

The substrate pump circuit 2 provides a charging current through the trench substrate resistor 5, to increase the potential on the ESD element 3 substrate, thereby lowering its threshold voltage Vt. The substrate charging circuit is triggered by the same electrostatic event which initially results in the conduction of ESD element 3.

Figure 2:
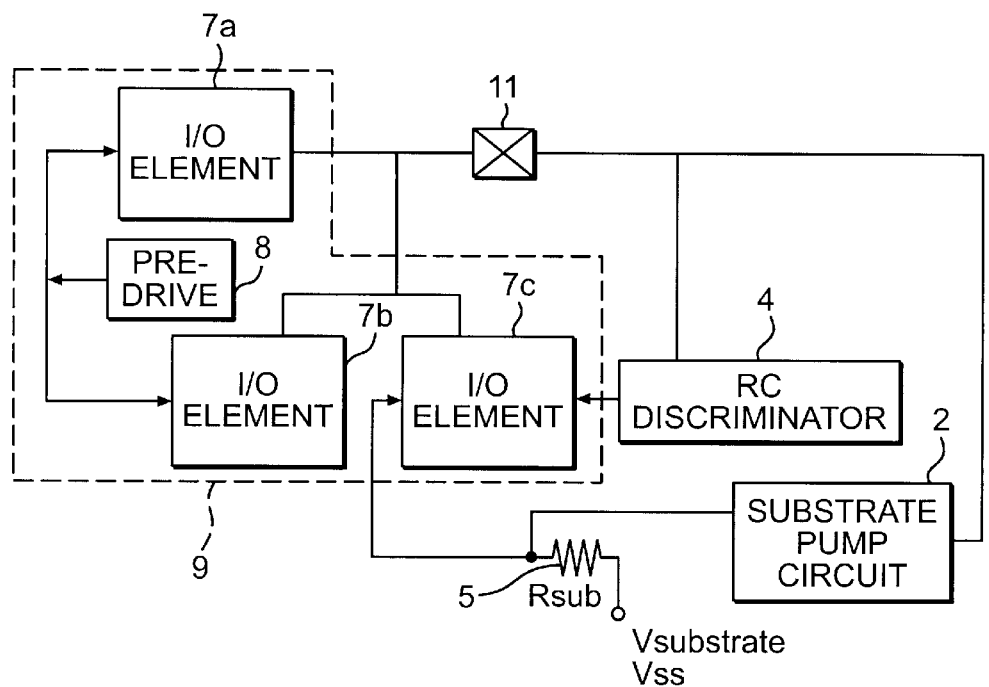
FIG. 2 represents a second implementation of an ESD element in accordance with the invention using an I/O element as the ESD device.

FIG. 2 shows a practical implementation of the ESD protection device which uses a device which is functionally associated with the input/output circuit 7 as the ESD element. As the input/output circuit 7 may comprise a predriver 8 and multiple transistors, 7a, 7b and 7c, one of which, 7c, may not be in use, the transistor 7c not in use may serve as the ESD element, providing it is located within a trench structure 9 so that the respective portion of the substrate may be charged. In this way, device overhead is conserved while obtaining the benefits of a lower threshold ESD element.

Figure 3A:
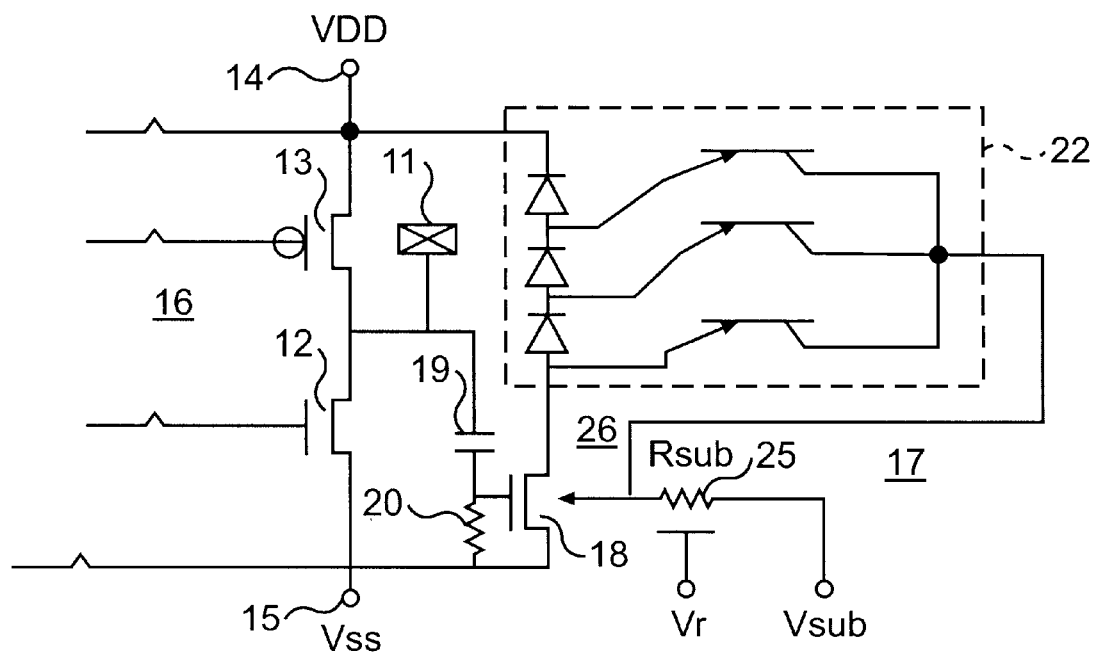
FIG. 3a illustrates, in accordance with one embodiment of the invention, a schematic representation of an ESD protection device.

Referring now to FIG. 3a, there is shown an embodiment of the invention for protecting an output buffer 16 of an integrated circuit against an electrostatic discharge to pad 11 which is the off chip connection for output buffer 16. The functionality provided by the output buffer 16 is conventionally implemented with two MOSFETs 12 and 13. MOSFETs 12, 13 can be an nFET or pFET or other off-chip driver devices known in the art.

The ESD protection circuit 17 is connected to pad 11 to dissipate any high voltage transients, such as an electrostatic discharge, received on pad 11. The pad 11 is connected in series with the nFET 18, to provide the mechanism to discharge the transient voltage.

The MOSFET 18 is formed as an nFET having a sufficient width to provide a current (I) carrying capability approaching that of an ESD or EOS event (e.g., I>100 ma). The ESD protection device 17 must render nFET transistor 18 conductive before the transient voltage produces an avalanche condition on output transistors 12 and 13 of the integrated circuit.

Figure 3B:
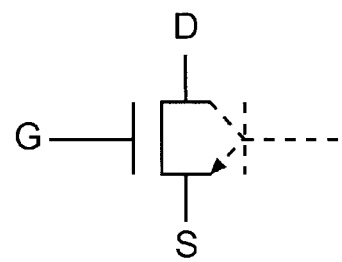
FIG. 3b illustrates the parasitic NPN transistor associated with the nFET 18.
Figure 4:
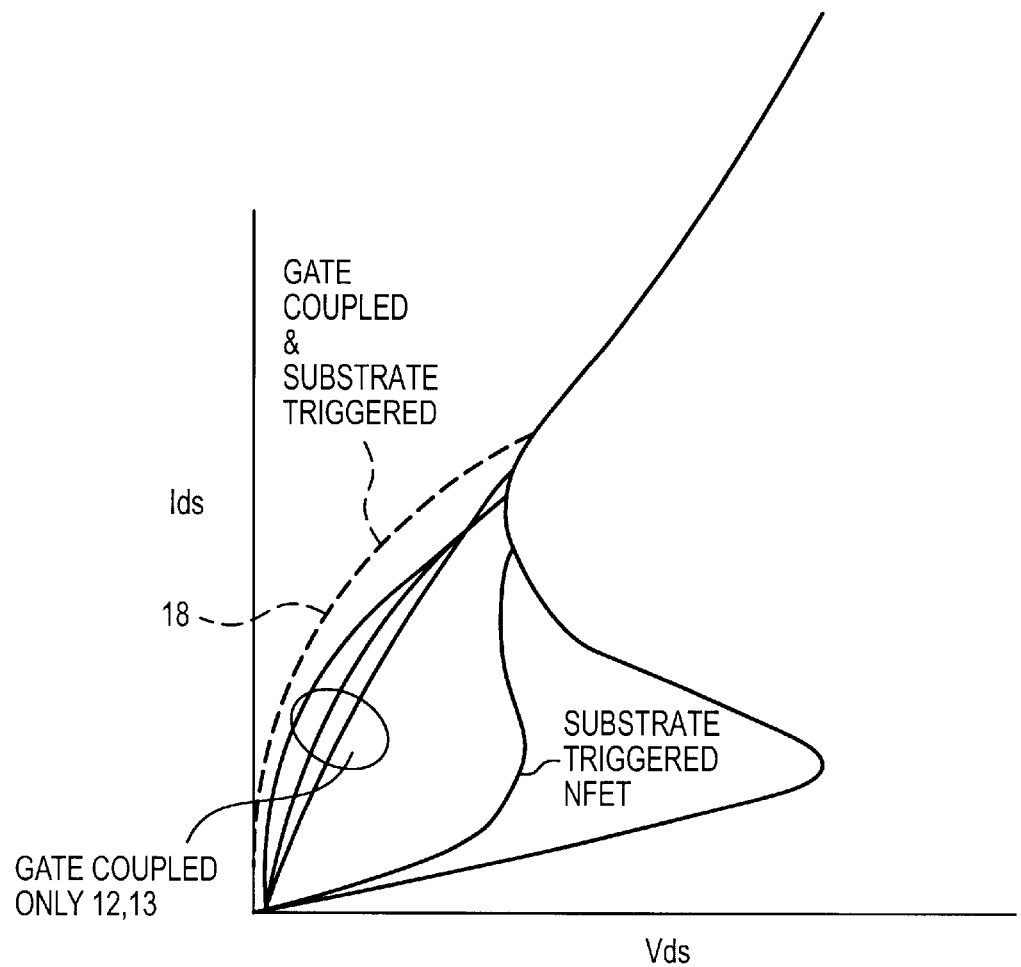
FIG. 4 illustrates the conduction of the series nFET transistor for discharging a transient voltage as compared with a functional nFET transistor connected to the same input terminal.

Turning now to FIG. 4, there is shown a representation of the current versus voltage characteristic for nFET 18 of FIG. 3, versus the same characteristic for transistor 12 and 13 of the functional circuit 16. The current through the transistor 18 increases much sooner than the current through the functional buffer circuit 16, thus reducing any voltage appearing across the circuit 16. Also shown in the figure is the turn on response of a device which is triggered only from substrate pumping of an MOSFET transistor.

FIG. 4 illustrates that nFET 18 is triggered into MOSFET conduction at a lower Vt, due to substrate pumping. Following this mode of operation, avalanche breakdown occurs between the substrate and drain, thus producing a parasitic NPN bipolar device schematically illustrated in FIG. 3b.

The combination of a lower threshold voltage nFET transistor and a parasitic NPN bipolar device, dissipates any voltage appearing on pad 11, before any similar avalanche breakdown might occur on the transistors 12 and 13 of the functional buffer circuit 16.

For a given Vds voltage and a given threshold voltage, a higher Ids is produced for nFET transistor 18 due to the gate coupling of the device to pad 11, as well as from the substrate pumping of the nFET transistor 18. The substrate 26 in which nFET transistor 18 is fabricated is effectively isolated from the remaining portion of the substrate of the integrated circuit by the trench isolation structure. The trench structure geometrically encloses the substrate volume which includes the ESD element 18, and may also enclose the trigger circuit 22. The result is an increase in substrate resistance RTR25 between the channel of nFET 18 and the lower integrated circuit substrate. Consequently, the potential at the underside of the channel of nFET 18 may be increased to reduce the nFET gate source threshold voltage Vt.

The gate of nFET transistor 18 is connected to a differentiating circuit comprising capacitor 19 and resistor 20. Transient voltage changes appearing on pad 11 are capacitively coupled to the gate of nFET transistor 18 rendering transistor 18 conducting to thus begin the ESD protection. As illustrated in FIG. 3a, the substrate 26 of MOS nFET device 18 is pumped through substrate resistance RTR25 with current from the trigger circuit 22 when a transient voltage is applied to terminal 11. The pumped substrate lowers the threshold voltage for enabling full conduction of nFET 18, which is followed by conduction in the snap-back mode, wherein conduction is by both the nFET transistor conduction and parasitic NPN bipolar transistor conduction, making it possible to dissipate the transient voltage before any breakdown or snapback occurs in the functional circuit transistors 12 and 13.

Figure 5:
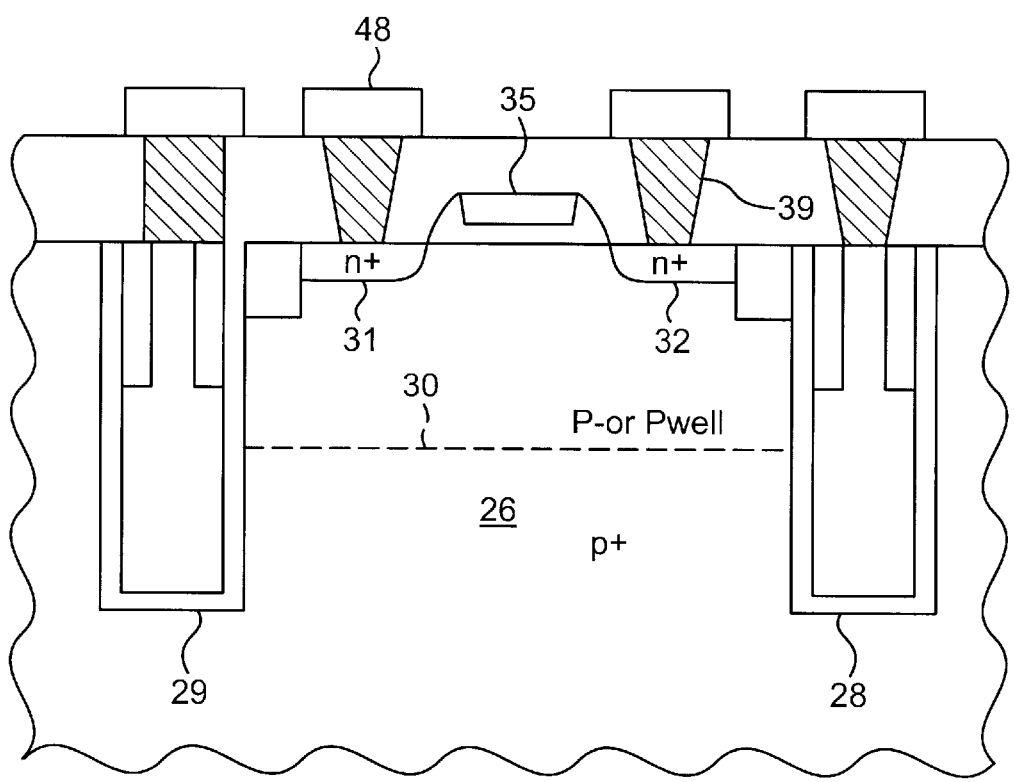
FIG. 5 represents a section view of the MOSFET transistor of FIG. 1.

The arrangement of circuit components in the integrated circuit for providing the isolated nFET transistor 18 and trigger circuit 22 is shown more particularly in FIG. 5. Referring now to FIG. 5, a section view of the nFET transistor 18 is shown. The nFET transistor 18 is formed on a substrate 26 which is p-doped. A lighter doped epitaxially grown region (EPI) 30 is epitaxially grown on substrate 26 and includes doped regions 31 and 32 representing the source and drain for nFET transistor 18. The EPI 30 may be a p-, or a p-well located on the surface of substrate 25. A gate dielectric 35, formed by well known integrated circuit technology, separates a polysilicon gate 33 from the EPI region 30. Connections to the source and drain are shown, through tungsten contacts 38 and 39 and metal wiring 40 and 41.

The area of the substrate under the nFET transistor 18 is isolated by the first and second deep trenches 28 and 29. First trench 28 and second trench 29 can be an enclosed ring or separate trenches. The deep trenches 28, 29 are structures similar to those which are used in DRAM technology to provide a memory capacitor, and all four sides of the nFET 18 may be enclosed by the trenches 28 and 29. Thus, as the region 30 is isolated from the rest of the substrate, it may be charged by a trigger circuit, to be described with respect to FIG. 6, to thus reduce the avalanche potential between the source 31 and substrate 30 producing a lower threshold voltage and lower snap-back voltage for the transistor.

Figure 6:
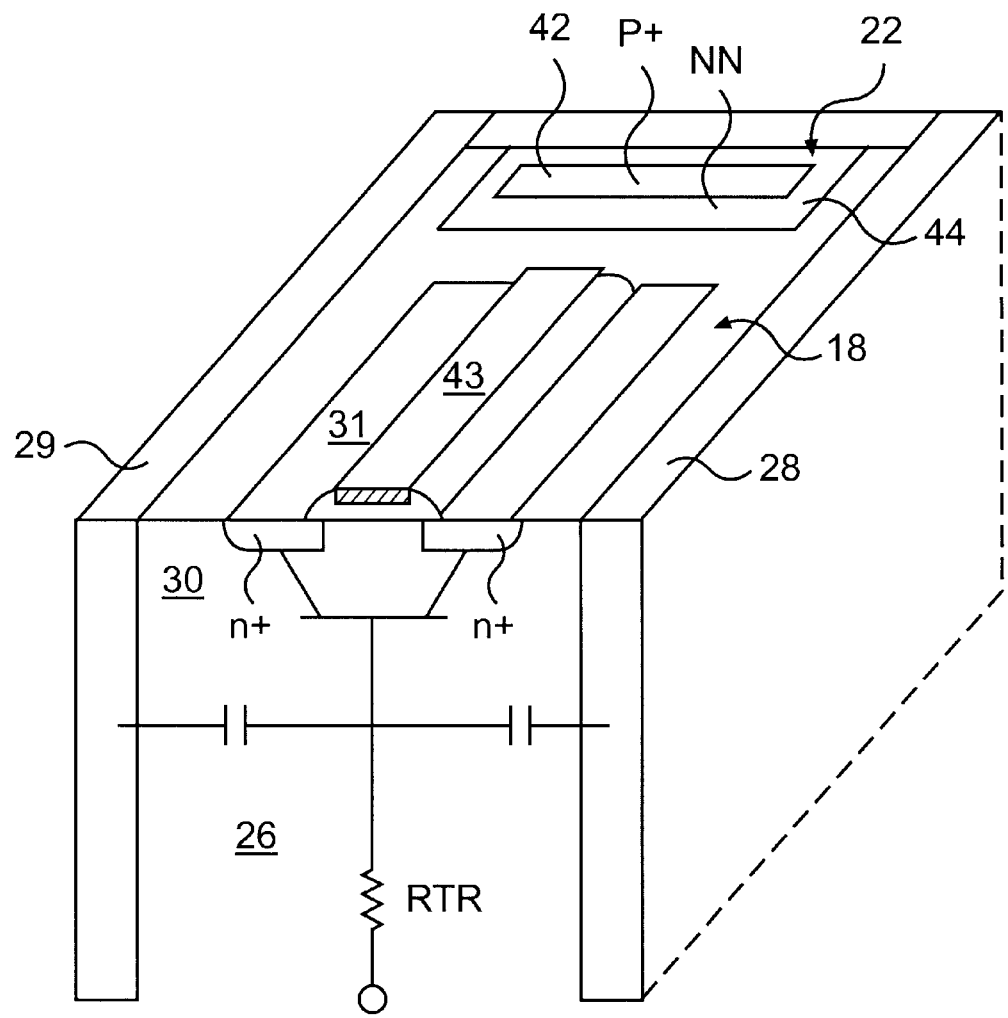
FIG. 6 illustrates a section view of the trigger circuit which charges the isolated substrate of FIG. 3.

FIG. 6 illustrates the relationship between the trigger circuit within the trench enclosure and the nFET transistor 18. The enclosed isolated substrate area 26 supports a vertical PNP transistor, comprising a diode 42 within an N-well 44. The resulting structure of diode 42 and the P substrate, produces a vertical bipolar PNP transistor. The collector of the vertical PNP, as is shown in FIG. 3a, is connected to the isolated substrate portion 26. P layer 42 is connected with a metalization layer, or wire (not shown) to the gate 43 of nFET transistor 18. The p material 42 is also connected to pad 11. Thus, charging of the area 30 in the isolated substrate 26 occurs when a transient voltage is applied to pad 11, through the substrate trigger circuit 22, thus lowering the nFET 18 gate source turn on voltage as well as the nFET snapback threshold voltage for nFET 18.

Figure 7:
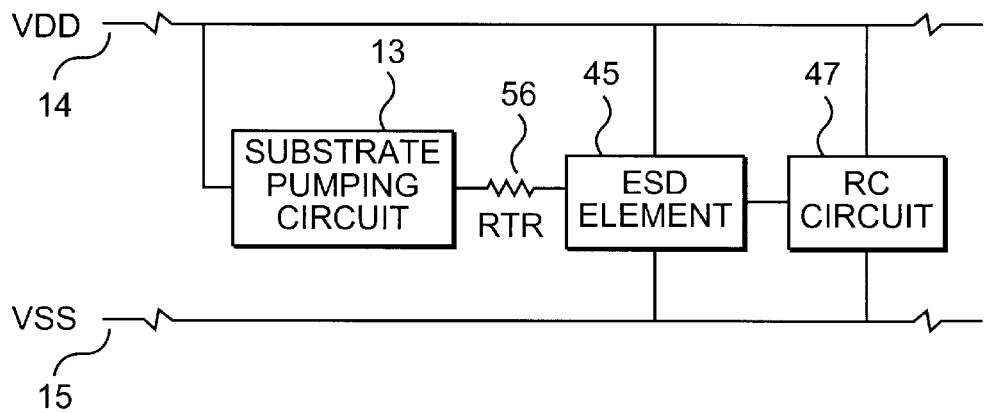
FIG. 7 represents a block diagram of a clamp circuit utilizing an ESD device in accordance with the present invention.
Figure 8:
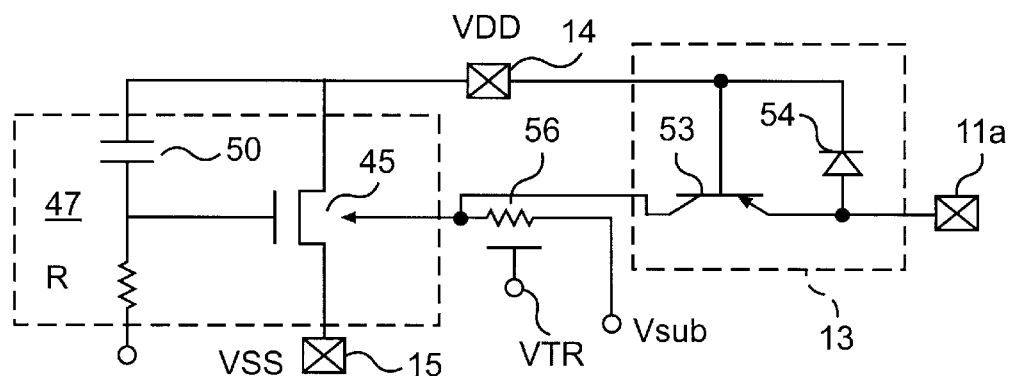
FIG. 8 illustrates an implementation of the ESD protection device as a power clamp.

The ESD protection device in accordance with the invention may also be implemented in a clamp circuit for the power supply connected to the integrated circuit. FIGS. 7 and 8, illustrate a block diagram and a specific implementation of a clamp circuit using a substrate trigger, similar to the foregoing, for maintaining the voltage across the supply lines Vdd-Vss clamped so that any excessive voltage on a single pad 11a is not coupled to the terminals 14 and 15. In this instance, the gate of the nFET transistor 45 is coupled through the RC filter and differentiation circuit 47 to the supply voltage Vdd. When a high voltage signal condition is applied to the pad 11a, it is coupled via diode 54 through capacitor 50 to the gate of MOS device 45. Potential $V_{TR}$ represents the potential at the outside of the isolated region, which coincides with the trench potential. Additionally, the isolated substrate in which the nFET transistor 45 is located is pumped via a vertical PNP transistor 53 through the substrate resistance 56.

Figure 9:
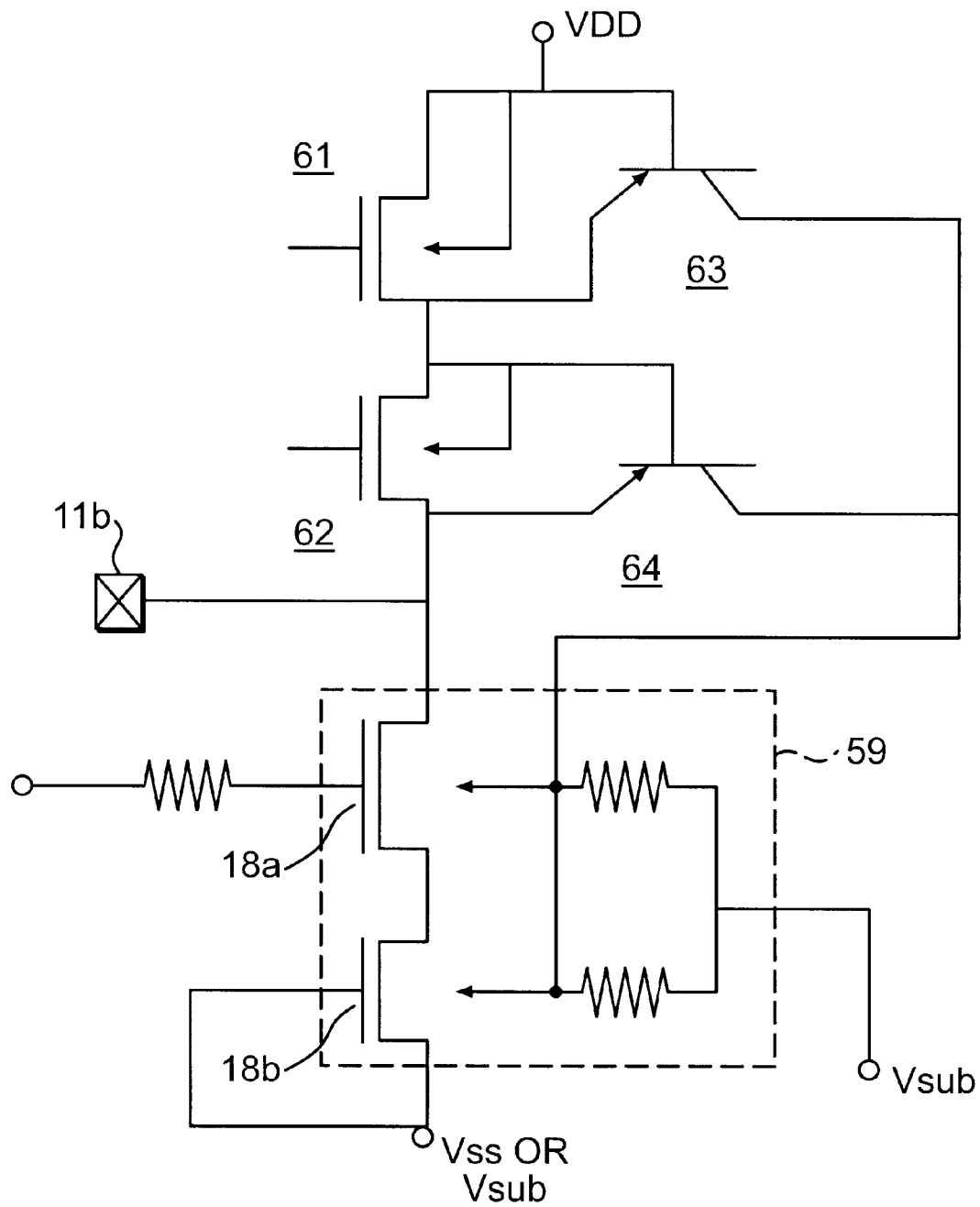
FIG. 9 illustrates an embodiment of the ESD protection device implementing a trigger circuit using pFET transistors, as well as a pair of nFET series current dissipation transistors.

Referring now to FIG. 9, there is shown yet another implementation of the device where the trigger circuit is implemented from a pair of pFET transistors 61, 62 in an N-well. The pair of PFET transistors 61,62 provide for a PNP bipolar charging circuit (shown as PNP transistors 63, 64) connecting the terminal lid to the isolated substrate region 59. The isolated substrate region 59 contains two nFET transistors 18a and 18b. The devices are configured as a pair to provide an increased dielectric breakdown for the individual devices. The second nFET transistor 18b is rendered in a conducting condition by connecting its gate to a common connection Vss, so that a switching is done entirely by device 18a.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A circuit for protecting an integrated circuit from a transient voltage comprising:
    a MOSFET transistor placed in an isolated substrate area, having a drain connection and a source connection serially connected between a terminal of said integrated circuit and a common terminal for said integrated circuit, and a gate connection which is coupled to said terminal; and
    a trigger circuit connected between said terminal and said isolated substrate area, for raising the voltage potential in the isolated substrate area in response to a transient voltage.

2. The circuit according to claim 1 wherein said isolated substrate area comprises a trench formed in said substrate, extending below a surface area containing said MOSFET transistor.

3. The circuit according to claim 1 wherein said trigger circuit is formed in said isolated substrate area.

4. The circuit according to claim 1 wherein said trigger circuit comprises a vertical PNP transistor formed in said isolated substrate area.

5. The circuit according to claim 3 wherein said trigger circuit comprises a pFET in said isolated substrate forming a PNP vertical transistor.

6. The circuit according to claim 1 wherein said MOSFET has said gate connection connected to said terminal through a capacitor, and connected to said source through a resistor, whereby said transient voltage is capacitively coupled to said gate connection.

7. The circuit according to claim 1 further comprising a second MOSFET transistor having a drain connection and source connection connected in series with said first MOSFET transistor drain and source connections.

8. The circuit according to claim 1 wherein said trigger circuit comprises two pFET transistors in series formed in said isolated substrate area.

9. A circuit for locally controlling a transient voltage potential on a terminal of an integrated circuit comprising:
    a isolated substrate area having an active element formed therein, the isolated substrate area defined by an isolation region extending into the integrated circuit substrate to a depth greater than a depth of the active element;
    a trigger circuit coupled to the isolated substrate area and to a node undergoing a transient voltage event for transiently raising a potential of the isolated substrate area in response to the transient voltage event and reducing the turn on voltage and/or electric potential of the active element.

10. The circuit for locally controlling a transient voltage potential according to claim 9 wherein said trigger circuit comprises a voltage or current source.

11. The circuit for locally controlling a transient voltage potential according to claim 9 wherein the trigger circuit is formed in the isolated substrate area.

12. The circuit for locally controlling a transient voltage potential according to claim 9 wherein the isolation region is formed by the integrated circuit in substrate.

13. The circuit for locally controlling a transient voltage potential according to claim 9 wherein said isolated substrate area is resistively isolated from an adjacent substrate area.

14. A circuit for protecting a semiconductor device from transient voltages comprising:

a transistor for dissipating said transient voltages to a common connection;

a pumping circuit for charging a substrate area containing said transistor thereby lowering the threshold voltage of said transistor; and a pulse differentiation circuit for coupling said transient voltage to said transistor whereby said transistor is rendered conducting at said lower threshold voltage.

15. The circuit for protecting semiconductor device according to claim 14 wherein said pumping circuit charges said substrate area containing said transistor in response to said transient voltage.

16. The circuit for protecting a semiconductor device according to claim 14 wherein said transistor is field effect transistor having a conduction channel located above said area charged by said pumping circuit.

17. The circuit for protecting a semiconductor device according to claim 14 wherein said substrate area is contained in an isolated trench area.

* * * * *